United States Patent
Park et al.

(10) Patent No.: US 9,305,778 B2
(45) Date of Patent: Apr. 5, 2016

(54) CONTROLLED MANUFACTURING METHOD OF METAL OXIDE SEMICONDUCTOR AND METAL OXIDE SEMICONDUCTOR STRUCTURE HAVING CONTROLLED GROWTH CRYSTALLOGRAPHIC PLANE

(71) Applicant: SAMSUNG ELECTRONICS CO., LTD., Suwon-si (KR)

(72) Inventors: Young-jun Park, Suwon-si (KR); Jung-inn Sohn, Hwaseong-si (KR); Seung-nam Cha, Seoul (KR); Ji-yeon Ku, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 176 days.

(21) Appl. No.: 13/859,250

(22) Filed: Apr. 9, 2013

(65) Prior Publication Data
US 2014/0138672 A1    May 22, 2014

(30) Foreign Application Priority Data

Nov. 16, 2012   (KR) .................. 10-2012-0130505

(51) Int. Cl.
| | |
|---|---|
| H01B 1/00 | (2006.01) |
| H01L 29/08 | (2006.01) |
| H01L 51/40 | (2006.01) |
| H01L 21/02 | (2006.01) |
| H01B 1/08 | (2006.01) |
| H01L 29/04 | (2006.01) |
| H01L 29/06 | (2006.01) |
| B82Y 10/00 | (2011.01) |
| H01L 29/22 | (2006.01) |

(52) U.S. Cl.
CPC ........... *H01L 21/02609* (2013.01); *B82Y 10/00* (2013.01); *H01B 1/08* (2013.01); *H01L 21/02554* (2013.01); *H01L 21/02603* (2013.01); *H01L 21/02636* (2013.01); *H01L 29/04* (2013.01); *H01L 29/0665* (2013.01); *H01L 29/0669* (2013.01); *H01L 29/22* (2013.01)

(58) Field of Classification Search
None
See application file for complete search history.

(56) References Cited

U.S. PATENT DOCUMENTS

| | | | |
|---|---|---|---|
| 6,586,095 B2 | 7/2003 | Wang et al. | |
| 6,808,743 B2 | 10/2004 | Petrella et al. | |
| 7,172,813 B2 | 2/2007 | Burgener, II et al. | |
| 7,736,698 B2 | 6/2010 | Hamilton et al. | |
| 2003/0084838 A1* | 5/2003 | McCandlish et al. | 117/68 |
| 2003/0198837 A1* | 10/2003 | Craven et al. | 428/698 |
| 2007/0151508 A1 | 7/2007 | Lu et al. | |
| 2008/0251816 A1* | 10/2008 | Tanaka et al. | 257/255 |
| 2008/0295886 A1* | 12/2008 | Hu et al. | 136/256 |

(Continued)

FOREIGN PATENT DOCUMENTS

| | | |
|---|---|---|
| KR | 1020070096607 A | 10/2007 |
| KR | 1020090015934 A | 2/2009 |

(Continued)

*Primary Examiner* — Mark Kopec
*Assistant Examiner* — Jaison Thomas
(74) *Attorney, Agent, or Firm* — Sughrue Mion, PLLC (57) ABSTRACT

A method of controlling a growth crystallographic plane of a metal oxide semiconductor having a wurtzite crystal structure by using a thermal chemical vapor deposition method includes controlling a growth crystallographic plane by allowing the metal oxide semiconductor to grow in a non-polar direction by using a source material including a thermal decomposition material that reduces a surface energy of a polar plane of the metal oxide semiconductor.

14 Claims, 7 Drawing Sheets

(56) References Cited

U.S. PATENT DOCUMENTS

| | | | |
|---|---|---|---|
| 2009/0068411 A1* | 3/2009 | Hong et al. | 428/172 |
| 2010/0117070 A1* | 5/2010 | Adekore et al. | 257/43 |
| 2010/0284893 A1* | 11/2010 | Richards et al. | 423/437.1 |
| 2010/0295040 A1* | 11/2010 | Horio et al. | 257/43 |
| 2011/0062437 A1* | 3/2011 | Chang et al. | 257/43 |
| 2011/0062440 A1* | 3/2011 | Adekore et al. | 257/43 |
| 2011/0284066 A1 | 11/2011 | Zimmerman et al. | |
| 2013/0099196 A1* | 4/2013 | Wu et al. | 257/9 |
| 2013/0200391 A1* | 8/2013 | Bedair et al. | 257/76 |
| 2013/0240876 A1* | 9/2013 | Chang et al. | 257/43 |

FOREIGN PATENT DOCUMENTS

| | | |
|---|---|---|
| KR | 1020100106680 A | 10/2010 |
| KR | 1020100130296 A | 12/2010 |

* cited by examiner

CONTROLLED MANUFACTURING METHOD OF METAL OXIDE SEMICONDUCTOR AND METAL OXIDE SEMICONDUCTOR STRUCTURE HAVING CONTROLLED GROWTH CRYSTALLOGRAPHIC PLANE

CROSS-REFERENCE TO RELATED APPLICATIONS

This application claims the benefit of Korean Patent Application No. 10-2012-0130505, filed on Nov. 16, 2012, in the Korean Intellectual Property Office, the disclosure of which is incorporated herein in its entirety by reference.

BACKGROUND

1. Field

The present disclosure relates to a method of controlling a growth crystallographic plane of a metal oxide semiconductor and a metal oxide semiconductor structure having a controlled growth crystallographic plane.

2. Description of the Related Art

ZnO, which is a metal oxide semiconductor having semiconductor properties, piezoelectric properties, superior transparency, and biocompatibility, has been much researched in a variety of fields. Also, since ZnO has a wide energy band gap of about 3.3 eV and a high exciton binding energy of about 60 meV, ZnO is gaining popularity in the field of various applied optics such as sensors, light-emitting devices, solar cells, and energy harvesting devices, and also in the field of electronic devices. However, it has been known that the photophysical properties and electric properties of ZnO are greatly affected by the polarity of ZnO. In particular, an internal field due to the polarity of ZnO affects the speed, time, and efficiency of an electron-hole recombination. Thus, controlling the polarity of ZnO is required to apply ZnO to the field of optical devices.

SUMMARY

Provided is a method of controlling a growth crystallographic plane of a metal oxide semiconductor wire and a metal oxide semiconductor structure having a controlled crystallographic plane.

Additional aspects will be set forth in part in the description which follows and, in part, will be apparent from the description, or may be learned by practice of the presented embodiments.

According to an aspect of the present invention, a method of controlled growth of a metal oxide semiconductor having a wurtzite crystal structure by using a thermal chemical vapor deposition (CVD) method includes controlling the orientation of crystal growth by allowing the metal oxide semiconductor to grow in a non-polar direction by using a source material including a thermal decomposition material that reduces a surface energy of a polar plane of the metal oxide semiconductor.

According to an embodiment, a method of controlling the orientation of a growth crystallographic plane of a metal oxide semiconductor nanostructure having a wurtzite crystal structure during by the growth of the metal oxide semiconductor nanostructure using a thermal chemical vapor deposition (CVD) method, said thermal chemical vapor deposition method employs a source material to grow the metal oxide semiconductor nanostructure comprising a polar surface (plane?) and a non-polar surface (plane?), said source material containing a source for the metal oxide semiconductor nanostructure and a thermal decomposition material, wherein the controlling method comprising controlling a the orientation of the growth of the metal oxide semiconductor nanostructure crystallographic plane by allowing the metal oxide semiconductor to grow in a non-polar direction by using a source material including allowing the a thermal decomposition material that to reduces a surface energy of a the polar surface (plane?) of the metal oxide semiconductor nanostructure.

Disclosed is a method of growing a metal oxide semiconductor nanostructure including steps of: (a) providing a substrate having a surface capable of growing a metal oxide semiconductor crystal; and (b) growing the metal oxide semiconductor crystal which has a polar surface and a non-polar surface on the substrate by supplying a source material under a chemical vapor deposition condition, said source material comprising a source for the metal oxide semiconductor and a thermal decomposition material, wherein the thermal decomposition material reduces a surface energy of the polar surface of the metal oxide semiconductor crystal, and wherein the metal oxide semiconductor crystal dominantly grows from the non-polar surface.

The crystal growth orientation may be controlled according to the content of the thermal decomposition material.

The metal oxide semiconductor may include a II-VI group metal oxide semiconductor.

The II-VI group metal oxide semiconductor may include ZnO.

The source material may include ZnO, graphite, and the thermal decomposition material, and a ZnO wire may grow in a non-polar direction.

The thermal decomposition material may be thermally decomposed at a ZnO growth temperature or lower.

The ZnO growth temperature may be about 800° C.-1200° C.

The thermal decomposition material may be thermally decomposed at about 500° C.-910° C.

A mole ratio of the thermal decomposition material may be about 0.01-100 of ZnO.

The thermal decomposition material may include GaAs.

A cross-sectional shape, in perpendicular to the growth direction, of the ZnO wire growing in the non-polar direction may include a rectangle, a diamond, or a polygon.

Lateral planes in a non-polar direction of the ZnO wire may include a non-polar plane, or a non-polar plane and a polar plane.

According to another aspect of the present invention, there is provided a metal oxide semiconductor structure including a metal oxide semiconductor having a controlled growth crystallographic plane by the method of controlling a growth crystallographic plane of a metal oxide semiconductor.

According to another aspect of the present invention, there is provided a metal oxide semiconductor structure including a metal oxide semiconductor having a wurtzite crystal structure and a controlled growth crystallographic plane growing in a non-polar direction.

According to still another aspect, there is provided a metal oxide semiconductor structure including a metal oxide semiconductor having a wurtzite crystal structure, said metal oxide semiconductor having a polar surface and a non-polar surface (plane?), wherein the polar surface is treated to have a reduced surface energy compared to the same polar surface in the absence of the modification The metal oxide semiconductor may include a thermally decomposed material that reduces a surface energy of a polar plane of the metal oxide semiconductor. The metal oxide semiconductor structure may further include at least one of an organic material layer and an inorganic material layer formed on a polar plane of the metal oxide semiconductor, thereby having a junction structure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. In the drawings, the size or thickness of each element may be exaggerated for clarity.

As used herein, the term "and/or" includes any and all combinations of one or more of the associated listed items. Expressions such as "at least one of," when preceding a list of elements, modify the entire list of elements and do not modify the individual elements of the list.

Throughout the specification, the term "ZnO wire," as used herein, is intended to include, but not be limited to, a one-dimensional nanostructure of ZnO, which can be in a shape of a wire-like structure, rod, belt, ring, spiral, helix, or the like.

The term "ZnO" wire also encompasses a hierarchal nanostructure formed of ZnO wires and another nanostructure of a different material.

The term "dominant" or "dominated" as used herein means that the "dominant" surface or plane of polarity has a larger surface area than the other surface or plane of non-polarity, or a crystal growth in one direction of a polar direction is greater than the crystal growth in a non-polar direction, and vice versa.

ZnO is a II-VI group metal oxide semiconductor and has a wurtzite crystal structure, in which a Zn ion is located at a tetrahedral interstitial site and an oxygen ion is located at a hexagonal site. Since ZnO is partially ion-bonded, a (0001) plane formed with Zn atoms only relatively is positively charged, whereas a (000$\bar{1}$) plane formed with oxygen atoms only relatively is negatively charged. Accordingly, polarities exist in a c-axis direction of a crystal structure. Polar planes such as the (0001) plane and the (000$\bar{1}$) plane have relatively large surface energy due to the above bonding characteristic and thus the polar planes have a fast growth speed, compared to non-polar planes.

Figure 1:
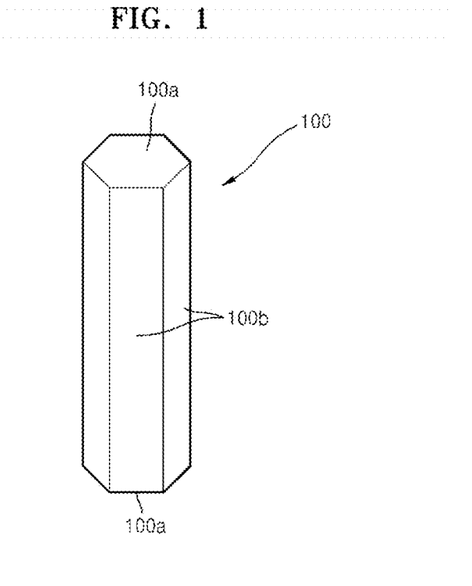
FIG. 1 is a perspective view illustrating a ZnO wire growing in a polar direction.

FIG. 1 illustrates a ZnO wire 100 grown in a polar direction. Referring to FIG. 1, polar planes 100a (which is the (0001) plane) have a faster growth speed than that of non-polar planes 100b (which is the (01$\bar{1}$0) or (2$\bar{1}\bar{1}$0) plane). ZnO grows in a polar direction, that is, the c-axis direction. The polar planes 100a are referred to as "growth crystallographic plane" or "crystal growth plane" throughout the disclosure. The ZnO wire 100 grown in the polar direction, as exemplified in FIG. 1, has a hexagonal cross-section, which is perpendicular to the crystal growth direction.

Figure 2:
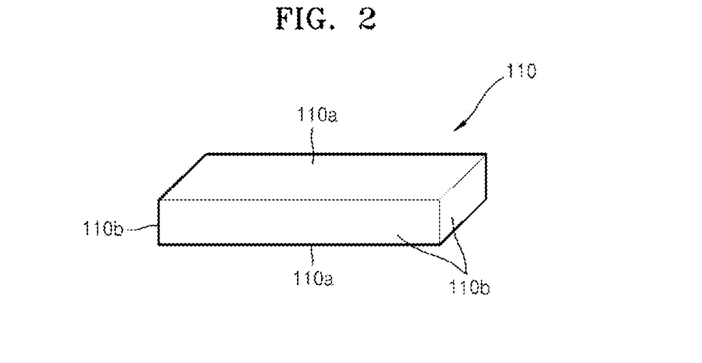
FIG. 2 is a perspective view illustrating a ZnO wire growing in a non-polar direction according to an embodiment of the present invention.

FIG. 2 is a perspective view illustrating a ZnO wire 110 grown in a non-polar direction, according to an embodiment of the present invention. Referring to FIG. 2, as described below, when a surface energy of polar planes 110a is reduced, non-polar planes 110b have a faster growth speed than that of the polar planes 110a. Accordingly, ZnO grows in a non-polar direction and thus the ZnO wire 110 having a growth crystallographic plane of 110b (which is the (01$\bar{1}$0) or (2$\bar{1}\bar{1}$0) plane)) may be obtained. Thus obtained ZnO wire is dominated by polar surfaces. The ZnO wire 110 growing in the non-polar direction may have a cross-sectional shape other than a hexagon. For example, the ZnO wire 110 growing in the non-polar direction may have a cross-sectional shape such as a square, a diamond, a trapezoid, or a polygon, but the present invention is not limited thereto.

A controlled manufacturing method of forming a ZnO wire having a non-polar growth crystallographic plane, i.e., growing the ZnO wire in the non-polar direction is described below. A thermal chemical vapor deposition (CVD) method may be employed to form a ZnO nanowire that grows in the non-polar direction. In this case, a thermal decomposition material that may reduce the surface energy of a polar plane may be included in a source material used in the thermal CVD method. The thermal decomposition material may further reduce the surface energy of polar planes to a value lower than that of the non-polar planes.

In the present embodiment, a source material including ZnO, graphite, and a thermal decomposition material may be used to control the orientation of ZnO wire growth to have dominant polar planes by using the thermal CVD method. The thermal decomposition material may be thermally decomposed at a temperature equal to or less than a ZnO growth temperature. For example, the thermal decomposition material may be thermally decomposed at about 500° C.-910° C. and the ZnO growth temperature may be about 800° C.-1200° C. However, the above temperature ranges are exemplary, and the thermal decomposition temperature of a thermal decomposition material and the ZnO growth temperature may vary depending on other variables. The mole ratio of the thermal decomposition material to ZnO may be about 0.01-100. The concentration of the thermal decomposition may be about 0.01-100 wt %. In another embodiment, the concentration of the thermal decomposition may be about 0.1 -20 wt %. However, embodiments of the present invention are not limited thereto. The growth crystallographic plane may be controlled according to the content of the thermal decomposition material.

A general CVD process for growing ZnO on a substrate is previously reported, for example in U.S. Pat. Nos. 7,172,813, 6,808,743, and 6,586,095, the contents of which are incorporated herein by reference. A ZnO wire can be grown on an appropriate substrate. For example, a ZnO substrate exposing on its surface (0001) plane of a Zn polarity plane (+c plane), SiC substrate having an Si polarity plane, a GaN substrate having a Ga polarity plane or the like may be used. A sapphire substrate may also be used. If the sapphire substrate is used, a preliminary surface treatment may be performed to allow ZnO crystal with the Zn polarity to be grown. A catalyst and nucleation conditions can be determined depending on desired properties, diameters or thickness, or other characteristics of the ZnO wire.

The thermal decomposition material may be, for example, GaAs. GaAs may be easily thermally decomposed at a temperature of about 650° C. or higher. To form a ZnO wire, ZnO, graphite, and GaAs are used as source materials and the thermal CVD method is performed at about 800° C.-1200° C. Consequently, GaAs is thermally decomposed into Ga atoms and As atoms. Then, the thermally decomposed Ga atoms and As atoms may be substituted with at least one of Zn atoms and O atoms in a ZnO crystal structure. As such, when the thermally decomposed Ga atoms and As atoms are substituted with at least one of Zn atoms and O atoms, the surface energy of the polar plane of ZnO may be greatly reduced, compared to that of the non-polar plane.

Table 1 shows calculation results of changes in the ZnO surface energy when GaAs that is a thermally decomposition material is added to a source material. In Table 1, "As→O" denotes a case when As atoms are substituted with O atoms and "Ga →Zn" denotes a case when Ga atoms are substituted with Zn atoms.

TABLE 1

| Substitution Type | Surface | Change in Surface Energy (J/m²) (Zn rich-O poor) | |
|---|---|---|---|
| | | Ga rich | As rich |
| As → O | (10$\bar{1}$0) | 0.51 | −0.75 |
| | (11$\bar{2}$0) | 0.94 | −0.52 |
| | (0001) | −0.70 | −1.87 |
| Ga → Zn | (10$\bar{1}$0) | 1.41 | 2.68 |
| | (11$\bar{2}$0) | 1.82 | 3.28 |
| | (0001) | 0.84 | 2.01 |

Figure 3:
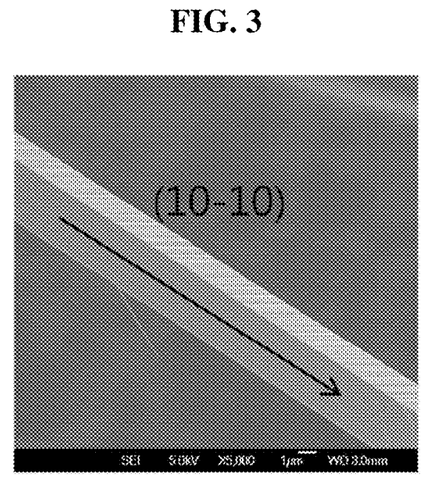
FIG. 3 is an scanning electron microscope (SEM) image of a ZnO wire growing in a non-polar direction, according to an embodiment of the present invention.

Referring to Table 1, it may be seen that the surface energy of the (0001) plane that is a polar plane is further reduced, compared to the (10$\bar{1}$0) plane and the (11$\bar{2}$0) plane that are non-polar planes. As such, when GaAs that is a thermally decomposition material is added to a source material, the surface energy of the polar plane of ZnO is further reduced, compared to the non-polar plane. Thus, ZnO grows from its non-polar plane in the non-polar direction. FIG. 3 is an SEM image of a ZnO wire growing in a [10$\bar{1}$0] crystal direction, that is, a non-polar direction, according to an embodiment of the present invention. It may be seen that, in the ZnO wire, the orientation of the ZnO wire growth could be controlled such a way that the (10$\bar{1}$0) plane became the growth crystallographic plane.

Figure 4:
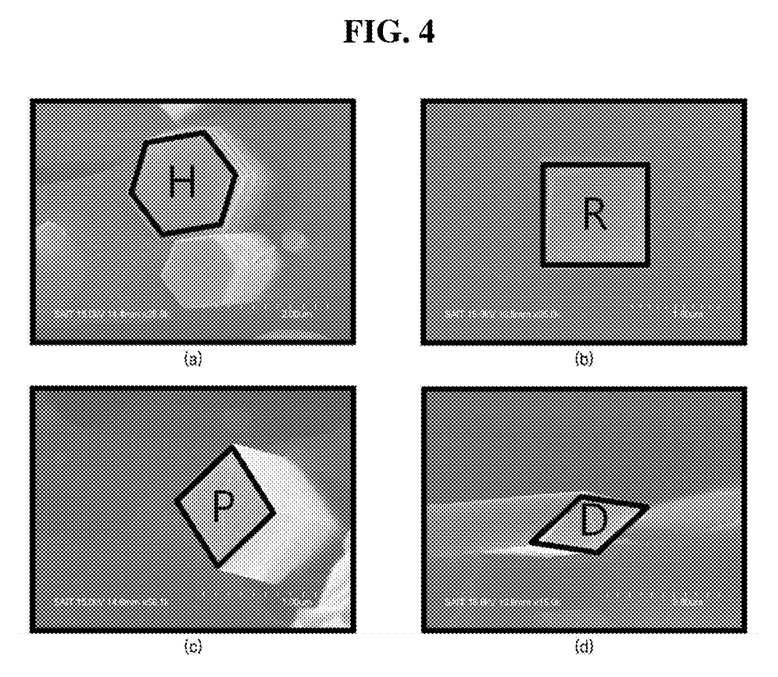
FIG. 4 is a set of SEM images showing cross-sections of ZnO wires growing in a polar direction and cross-sections of ZnO wires, which is taken in perpendicular to the growth direction, growing in a non-polar direction.

The shape, growth direction, and growth crystallographic plane of a grown ZnO wire may be controlled by adjusting the ratio of a GaAs content and a ZnO content in the source material. FIG. 4 is a set of SEM images showing cross-sections of ZnO wires growing in a polar direction ((a)) and cross-sections of ZnO wires growing in a non-polar direction ((b)-(d)). Referring to FIG. 4, "H" denotes a hexagonal cross-section, R denotes a rectangular cross-section, P denotes a polygonal cross-section, and D denotes a diamond cross-section.

Table 2 shows an analysis of the cross-sectional shape of a ZnO wire according to the ratio of a GaAs content and a ZnO content. The results shown in Table 2 are obtained by analyzing the cross-section of a ZnO wire that grows according to a change in the mole ratio between ZnO and GaAs on the conditions that a growth temperature is about 900° C. and the ZnO content is 20 mg, 50 mg, 100 mg, and 200 mg.

TABLE 2

Analysis of cross-sectional shape of ZnO wire

| | Ratio of GaAs:ZnO | | | | | | | |
|---|---|---|---|---|---|---|---|---|
| ZnO | 40:1 | 20:1 | 10:1 | 5:1 | 2:1 | 1:1 | 1:½ | 1:¼ |
| 20 mg | | P, H | H | H, P | H | H | H, P | |
| 50 mg | | H, D | H, D | D, P | R | P | H, P | H, P |
| 100 mg | H, D | D | D | P | R | R | P | P |
| 200 mg | | D | D | D | P, D | D | D | |

Referring to Table 2, when the ZnO wire are grown in various GaAs concentrations, the ZnO wire may grow in a variety of non-polar directions so as to have various cross-sectional shapes, for example, a rectangle, a diamond, or a polygon. Accordingly, the orientation of ZnO wire growth is controlled to have various crystallographic planes by adjusting the GaAs content. Therefore, lateral planes of the ZnO wires grown in non-polar direction may include non-polar plane or both of non-polar plane and polar plane.

Figure 5:
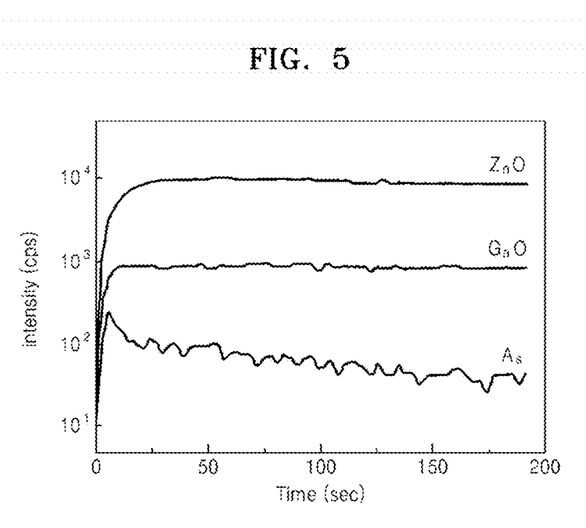
FIG. 5 is a graph showing a result of a secondary ion mass spectrometry (SIMS) analysis of a ZnO wire growing in a non-polar direction, according to an embodiment of the present invention.

FIG. 5 is a graph showing a result of a secondary ion mass spectrometry (SIMS) analysis of a ZnO wire growing in a non-polar direction, according to an embodiment of the present invention. Referring to FIG. 5, when a ZnO wire grows by including GaAs in a source material, Ga and As exist inside the ZnO wire at a similar ratio.

Figure 6A:
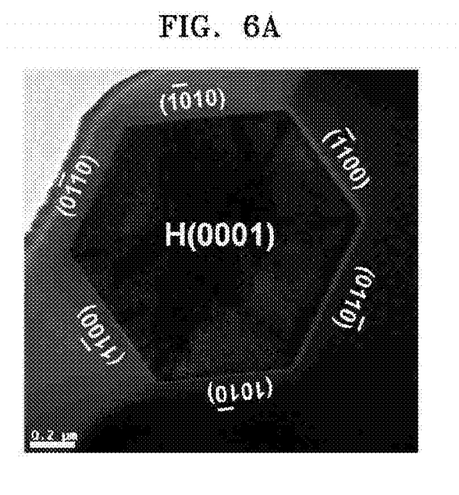
FIGS. 6A and 6B are, respectively, a transmission electron microscope (TEM) image and a SAED image of a ZnO wire in which the growth crystallographic plane is the (0001) plane.
Figure 6B:
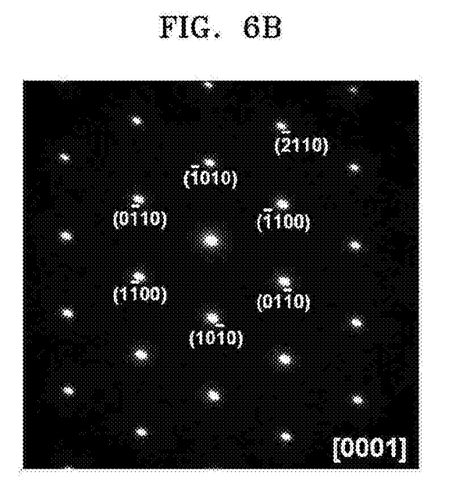
Figure 7A:
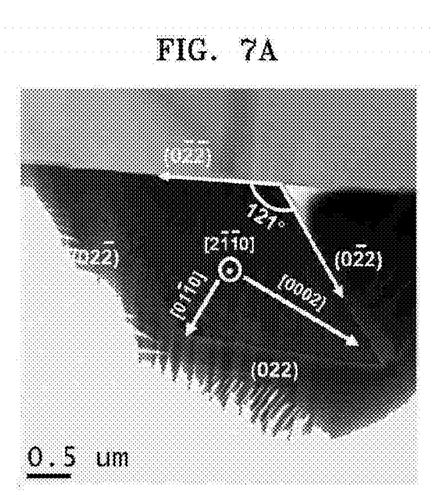
FIGS. 7A and 7B are, respectively, a TEM image and a selected area electron diffraction (SAED) image of a ZnO wire in which the growth crystallographic plane is the (2$\bar{1}$10) plane.
Figure 7B:
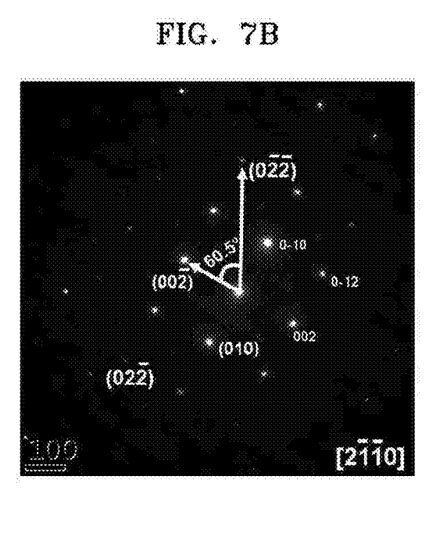
Figure 8A:
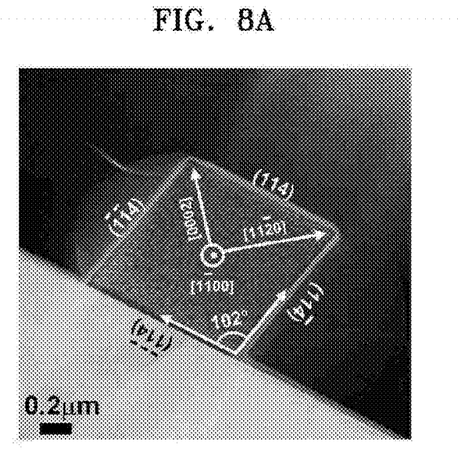
FIGS. 8A and 8B are, respectively, a TEM image and a SAED image of a ZnO wire in which the growth crystallographic plane is the (1$\bar{1}$00) plane.
Figure 8B:
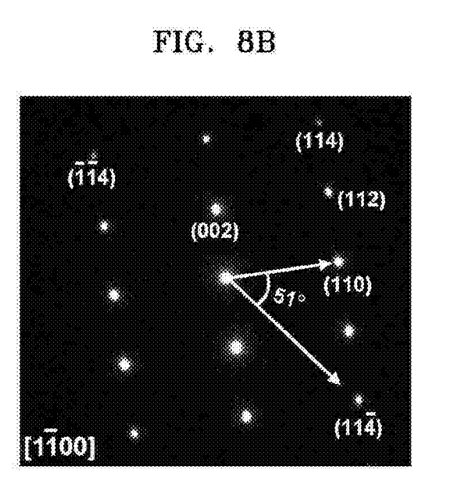

FIGS. 6A and 6B are, respectively, a transmission electron microscopy (TEM) image and a selected area electron diffraction (SAED) image of a ZnO wire in which a growth crystallographic plane is the (0001) plane. FIGS. 7A and 7B are, respectively, a TEM image and a SAED image of a ZnO wire in which a growth crystallographic plane is the (2110) plane. FIGS. 8A and 8B are, respectively, a TEM image and a SAED image of a ZnO wire in which a growth crystallographic plane is the (1100) plane. As illustrated in FIGS. 7A through 8B, it is confirmed from the TEM and SAED analyses that the controlled manufacturing methods of ZnO wires according to embodiments of the invention allow to produce ZnO wires having a structure in which the growth direction and the growth crystallographic plane are controlled.

Figure 9:
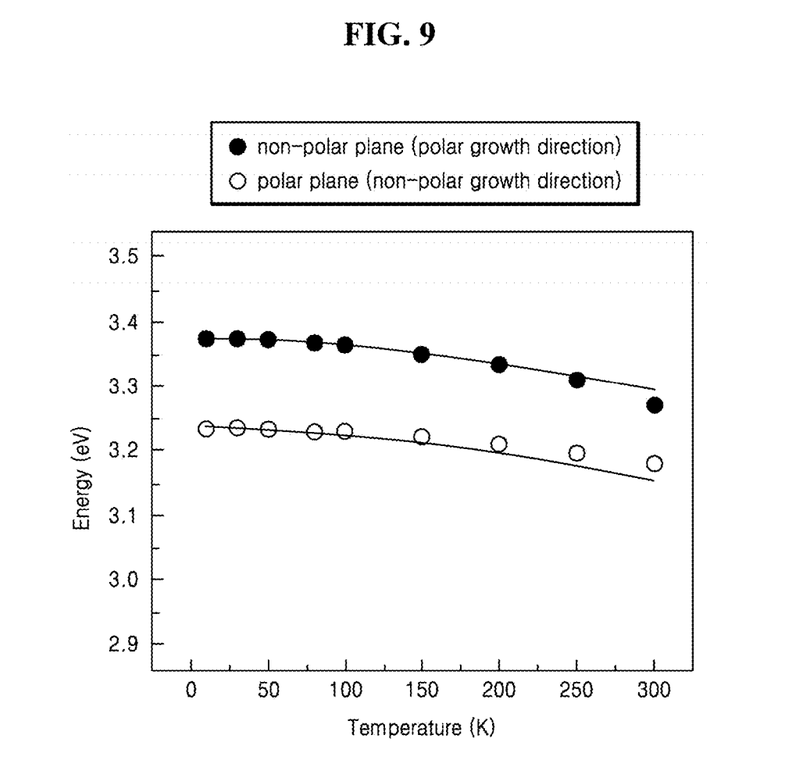
FIG. 9 is a graph showing results of a photoluminescence (PL) analysis of a ZnO wire growing in a polar direction and a ZnO wire growing in a non-polar direction.

FIG. 9 is a graph showing results of a photoluminescence (PL) analysis of a ZnO wire grown in a polar direction and a ZnO wire grown in a non-polar direction. Referring to FIG. 9, a non-polar plane of the ZnO wire growing in a polar direction and a polar plane of the ZnO wire growing in a non-polar direction may have different characteristics from each other due to an energy difference therebetween.

Figure 10:
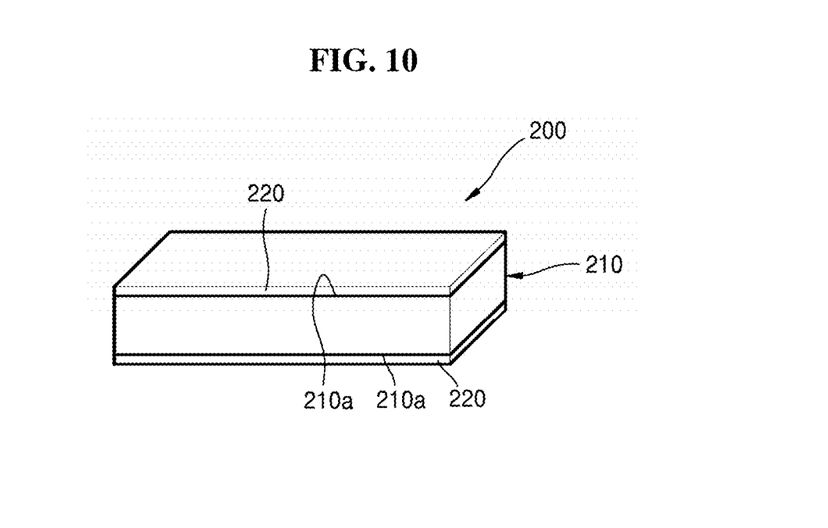
FIG. 10 is a perspective view of a metal oxide semiconductor structure, according to an embodiment of the present invention.

FIG. 10 is an illustrative perspective view of a metal oxide semiconductor structure 200 according to an embodiment of the present invention. Referring to FIG. 10, the metal oxide semiconductor structure 200 according to the present embodiment includes a ZnO wire 210 growing in a non-polar direction and a material layer 220 formed on each of polar planes 210a of the ZnO wire 210. Since the ZnO wire 210 growing in the non-polar direction is already described in detail in the above-described embodiment, a description thereof will be omitted herein. The material layer 220 may include at least one of an organic material layer and an inorganic material layer. An organic semiconductor, an inorganic semiconductor, or a liquid crystal compound may be selectively used as a material for forming the material layer 220. The material layer 220 may form a p-n junction with the polar plane 210a of the ZnO wire 210.

The above-described ZnO wire growing in a non-polar direction and having a controlled growth crystallographic plane and a metal oxide semiconductor structure having the ZnO wire may be embodied in a variety of semiconductor devices. A semiconductor device having the metal oxide semiconductor structure may be applied to a variety of fields of applied optics such as sensors, light-emitting devices, solar cells, and energy harvesting devices, and to the field of electronic devices. Also, although ZnO as a alone has been II-VI group metal oxide semiconductors described in detail in the above-described embodiments, other II-VI group metal oxide semiconductors may also be fabricated to have controlled and well-defined orientation and shape, according to embodiments of the invention.

According to the present invention, when a metal oxide semiconductor having a wurtzite crystal structure grows by using a thermal CVD method, the metal oxide semiconductor may grow in a non-polar direction by adding, to a source material, a thermal decomposition material that may reduce a surface energy of a polar plane of the metal oxide semiconductor. Accordingly, a metal oxide semiconductor structure including a metal oxide semiconductor having a controlled growth crystallographic plane, and a semiconductor device having the metal oxide semiconductor structure, may be embodied.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A metal oxide semiconductor structure including a metal oxide semiconductor having a wurtzite crystal structure, said metal oxide semiconductor having a polar surface and a non-polar surface, wherein the polar surface is treated to have a reduced surface energy compared to the same polar surface in the absence of the modification,
wherein the metal oxide semiconductor structure is grown in a non-polar direction, and
wherein lateral planes in a non-polar direction of the metal oxide semiconductor structure comprise a non-polar surface, or a non-polar surface and a polar surface.

2. The metal oxide semiconductor structure of claim 1, wherein the metal oxide semiconductor comprises a thermally decomposed material that reduces a surface energy of a polar surface of the metal oxide semiconductor.

3. The metal oxide semiconductor structure of claim 2, wherein the metal of the metal oxide semiconductor comprises a metal of Group II-VI in the periodic table.

4. The metal oxide semiconductor structure of claim 3, comprising a ZnO wire grown in a non-polar direction.

5. The metal oxide semiconductor structure of claim 4, wherein the thermally decomposed material comprises at least one of Ga and As.

6. The metal oxide semiconductor structure of claim 4, wherein a cross-sectional shape of the ZnO wire comprises a rectangle, a diamond, or a polygon.

7. The metal oxide semiconductor structure of claim 1, further comprising at least one of an organic material layer and an inorganic material layer formed on the polar surface of the metal oxide semiconductor, thereby having a junction structure.

8. A semiconductor device comprising the metal oxide semiconductor structure of claim 7.

9. A semiconductor device comprising the metal oxide semiconductor structure of claim 1.

10. A method of producing a metal oxide semiconductor crystal structure, comprising steps of:
(a) providing a substrate having a surface capable of growing a metal oxide semiconductor crystal; and
(b) growing the metal oxide semiconductor crystal which has a polar surface and a non-polar surface on the substrate in a non-polar direction by supplying a source material under a thermal chemical vapor deposition condition employing a certain temperature and a certain pressure, said source material comprising a source for forming the metal oxide semiconductor and a thermal decomposition material,
wherein the thermal decomposition material decomposes at a temperature equal to or lower than the temperature for growing the metal oxide semiconductor crystal,
wherein the metal oxide semiconductor crystal structure includes a metal oxide semiconductor having a wurtzite crystal structure, said metal oxide semiconductor having a polar surface and a non-polar surface,
wherein the polar surface of the metal oxide semiconductor crystal structure has a reduced surface energy compared to the same polar surface of a crystal structure grown under the same condition in the absence of the thermal decomposition material, and
wherein lateral planes in a non-polar direction of the metal oxide semiconductor structure comprise a non-polar surface, or a non-polar surface and a polar surface.

11. The method of claim 10, wherein the ZnO growth temperature is about 800° C.- 1200° C.

12. The method of claim 10, wherein the thermal decomposition material is thermally decomposed at about 500° C.- 910° C.

13. The method of claim 10, wherein the thermal decomposition material comprises GaAs.

14. The method of claim 10, wherein a mole ratio of the thermal decomposition material to ZnO is about 0.01-100 mol %.

* * * * *